United States Patent
Alexander et al.

(10) Patent No.: US 6,693,473 B2
(45) Date of Patent: Feb. 17, 2004

(54) DELAY LOCK LOOP HAVING A VARIABLE VOLTAGE REGULATOR

(75) Inventors: George W. Alexander, Durham, NC (US); Jinhwan Lee, Raleigh, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/100,713

(22) Filed: Mar. 19, 2002

(65) Prior Publication Data

US 2003/0179026 A1 Sep. 25, 2003

(51) Int. Cl.[7] .................................................. H03L 7/06
(52) U.S. Cl. ........................................ 327/158; 327/149
(58) Field of Search ................................. 327/149, 153, 327/158, 161, 270, 271, 272, 276, 277, 281; 331/176, DIG. 2; 375/375, 376

(56) References Cited

U.S. PATENT DOCUMENTS 5,339,020 A * 8/1994 Siligoni et al. ............. 323/313
5,359,303 A * 10/1994 Mirow ......................... 331/176
5,926,046 A * 7/1999 Uchida ........................ 327/158
6,229,364 B1 * 5/2001 Dortu et al. ................. 327/158
6,259,612 B1 * 7/2001 Itoh ............................. 363/60
6,438,067 B2 * 8/2002 Kuge et al. ................. 365/233

* cited by examiner

*Primary Examiner*—Timothy P. Callahan
*Assistant Examiner*—Linh Nguyen
(74) *Attorney, Agent, or Firm*—Thomas R. FitzGerald, Esq.

(57) ABSTRACT

A delay lock loop circuit includes a forward delay circuit having a plurality of delay elements. Each delay element has a delay time of one unit delay time. The forward delay circuit and each of the delay elements are powered by a supply voltage. The supply voltage is set to thereby set the duration of a unit delay time. Moreover, a feedback delay circuit is provided in order to cause a feedback delay time being substantially equal to a propagation delay of the IC. As the operating conditions of IC change, and the propagation delay thereof increases or decreases, the feedback delay time changes accordingly, and thus the delay caused by forward delay circuit tracks the change in the propagation delay of the IC.

6 Claims, 2 Drawing Sheets

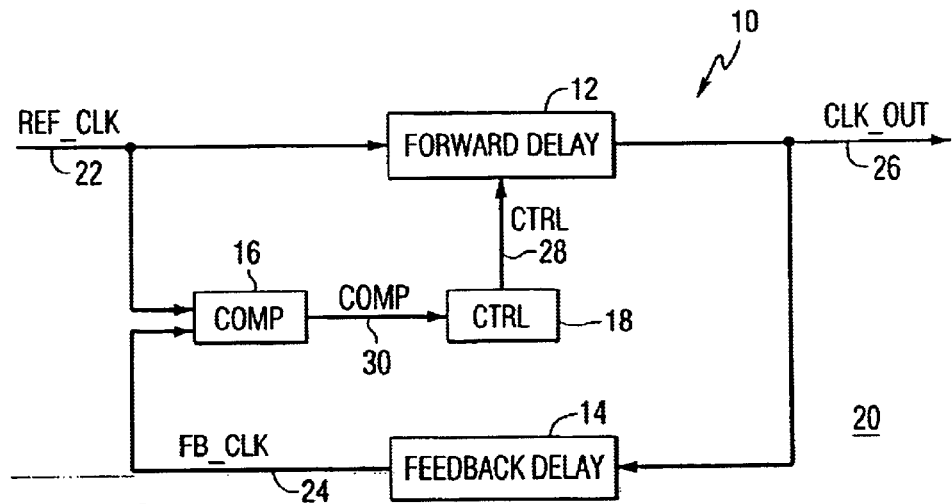
FIG. 1
PRIOR ART
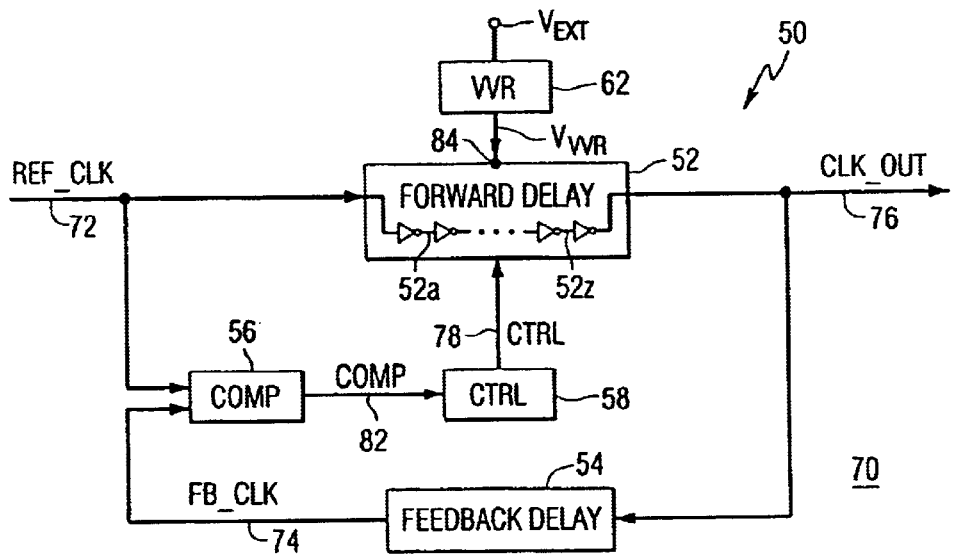
FIG. 2
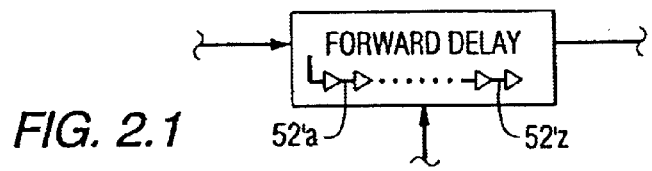
FIG. 2.1

DELAY LOCK LOOP HAVING A VARIABLE VOLTAGE REGULATOR

FIELD OF THE INVENTION

The present invention relates generally to integrated circuits, and, more particularly, to a delay lock loop circuit.

BACKGROUND OF THE INVENTION

Clock signals are used in virtually every integrated circuit (IC) to control the operational timing of the IC and/or the transfer of data within and between ICs. For example, all individual circuits or devices, such as, for example, flip-flops and/or latches, in a given IC may change state on a single rising or falling edge of a common clock signal. Relatively large ICs, such as, for example, memory chips, programmable logic arrays, or any other IC that requires clock skew adjustment, include thousands or even millions of such individual circuits or devices. The clock signal is typically applied to a clock input pin of the IC for distribution to each of those numerous devices throughout the IC. Thus, the clock signal is transmitted or propagated from the clock input pin to devices on the IC that are both relatively near to and relatively distant from the clock input pin. By the time the clock signal reaches the devices that are disposed on portions of the IC that are relatively remote from the input pin, the clock signal is likely to have suffered significant propagation delay.

The clock signal received at the IC clock input is hereinafter referred to as the input or reference clock signal REF_CLK, whereas the clock signal received by the last-served device on the IC is hereinafter referred to as the propagated clock signal P_CLK. The propagation delay between the REF_CLK and P_CLK signals, designated hereinafter as $t_P$, may cause difficulties in interfacing between ICs and/or slow down the overall operating speed of a system. For example, data may be provided or input to an IC in a time-aligned manner with the reference clock signal, whereas data output from the IC is likely to be provided in a time-aligned manner with the propagated clock signal.

The propagation delay $t_P$ for a particular IC is dependent at least in part upon the configuration of that particular IC. Thus, for a given IC $t_P$ is generally fixed. However, $t_P$ will vary due to external factors, such as, for example, changes in ambient temperature, package temperature, and/or applied voltage. It is beneficial to compensate for the effect of such external factors on the propagation delay $t_P$ of the reference clock signal by time-aligning the propagated clock signal P_CLK of an IC with the reference clock signal REF_CLK. Delay lock loop circuits are one way in which such time alignment is performed.

Delay lock loop (DLL) circuits receive the reference clock signal REF_CLK and produce an output clock signal CLK_OUT that is advanced or delayed relative to the reference clock signal REF_CLK. For convenience, all signals produced by a DLL will hereinafter be referred to as being delayed relative to the REF_CLK signal regardless of whether the particular signal is actually advanced or delayed relative to the reference clock signal. A DLL delays the output clock signal CLK_OUT by an amount of time that is approximately equal to the propagation delay $t_P$ of the IC, i.e., the amount of time required for the reference clock signal REF_CLK to propagate through the IC. Further, a DLL adjusts the CLK_OUT signal to compensate for changes in $t_P$ due to the aforementioned external factors.

Devices formed on portions of the IC that are proximate the clock input pin are typically supplied with the REF_CLK signal, whereas devices formed on portions of the IC relatively distant from the input clock signal are typically supplied with the CLK_OUT signal. Thus, all devices on the IC receive clock signals that are aligned in time.

The DLL adjusts the amount of time by which the CLK_OUT signal is delayed relative to the REF_CLK signal by comparing the REF_CLK signal to a feedback clock signal FB_CLK. The FB_CLK signal is essentially a delayed version of the CLK_OUT signal. The FB_CLK signal is delayed by a feedback delay circuit that models the propagation delay through an integrated circuit. The time delay of the FB_CLK signal relative to the CLK_OUT signal is, for example, proportional or equal to the propagation delay $t_P$ of the IC under the predefined operating conditions. As the external factors affect the propagation delay through the IC, they also affect the time delay introduced by the feedback delay circuit.

The CLK_OUT signal is essentially a delayed version of the REF_CLK signal. The delay of the CLK_OUT signal is adjusted by a forward delay circuit having a forward delay line, such as, for example, a predetermined number of buffers or invertors connected together in series. The length of the forward delay line is adjusted based upon a comparison of the REF_CLK signal to the feedback clock signal FB_CLK, to thereby adjust the delay of the CLK_OUT signal and to time align the CLK_OUT signal to the REF_CLK signal at the end of the clock tree. Thus, changes in the propagation delay due to the external factors are compensated for and the clock signals are time aligned for a range of operating conditions and parameters.

In designing DLLs, a tradeoff between conflicting design goals has heretofore been required. The first design goal of a conventional DLL is to provide a maximum delay time approximately equal to the longest anticipated cycle time (i.e., the lowest operating frequency) of the REF_CLK signal to ensure alignment of the signals under worst-case operating conditions. The second design goal is to provide high resolution, i.e., small time increments, in the adjustment of the delay of the CLK_OUT signal, to maximize time alignment of the clocks and, therefore, the operating speed of the IC. Satisfying both of those goals results in a DLL requires a delay line with a multitude of power-consuming delay stages. The multitude of delay stages provides the high resolution and wide frequency adjustment range, but consumes large amounts of power and time to reach a locked state wherein the clock signals are aligned. Further, such long delay stages consume valuable space on the substrate of the integrated circuit.

Therefore, what is needed in the art is a DLL that achieves a relatively high resolution with relatively few delay stages.

Furthermore, what is needed in the art is a DLL that achieves a given delay time with fewer delay stages.

SUMMARY OF THE INVENTION

The present invention provides a delay lock loop circuit for time aligning a reference clock signal with an internal feedback clock signal that tracks changes in the propagation delay of an integrated circuit.

The invention comprises, in one form thereof, a delay lock loop circuit that includes a forward delay circuit having a plurality of delay elements. Each delay element has a delay time of one unit delay time. The forward delay circuit and each of the delay elements are powered by a supply voltage. The supply voltage is set to thereby set the duration of a unit delay time.

An advantage of the present invention is that the unit delay time is adjusted to a predetermined and desired value by adjusting the voltage level supplied to the delay line by the voltage supply Thus, the DLL can be tailored to specific applications.

A further advantage of the present invention is that the unit delay time can be increased, thereby in effect lengthening the forward delay line, without adding additional delay stages to or changing the design of the DLL.

A still further advantage of the present invention is that the unit delay time can be decreased, thereby increasing the resolution of the DLL, without decreasing the number of delay stages or changing the design of the DLL.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein:

FIG. 1 is a block diagram of a conventional DLL;

FIG. 2 is a block diagram of the DLL of the present invention showing inverter delay pairs;

FIG. 2.1 is a partial block diagram corresponding to FIG. 2 and showing buffer delay pairs.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION DRAWINGS

Figure 3:
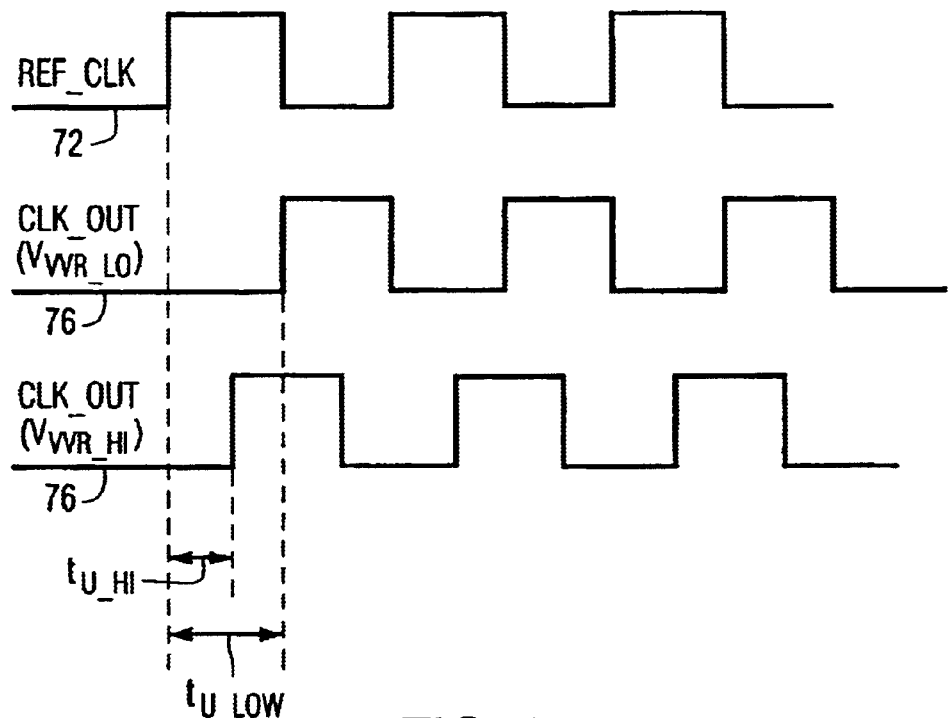
FIG. 3 is a timing diagram showing the inverse relationship between the supply voltage of the forward delay circuit and the unit time delay of the DLL of FIG. 2.

Referring now to FIG. 1, a block diagram of a conventional DLL circuit is shown. DLL circuit 10 includes forward delay circuit 12, feedback delay circuit 14, compare circuit COMP 16 and control circuit CTRL 18. Typically, DLL circuit 10 is formed on a common substrate with, or is commonly packaged with and interconnected to, integrated circuit (IC) 20, such as, for example, a dynamic random access memory (DRAM) chip. Generally, DLL circuit 10 receives reference clock signal REF_CLK 22, compares REF_CLK 22 to a feedback clock signal FB_CLK 24, and issues output clock signal CLK_OUT 26 based at least in part upon the comparison. The comparison is iterated until REF_CLK signal 22 is aligned in time with the FB_CLK signal 24, thus ensuring that CLK_OUT signal 26 has the correct phase at the end of the clock tree.

Forward delay circuit 12 is electrically connected to CTRL circuit 18 and receives therefrom CTRL signal 28. Forward delay circuit 12 receives REF_CLK signal 22 and issues CLK_OUT signal 26, which is generally a delayed version of REF_CLK signal 22. The amount of time by which forward delay circuit 12 delays CLK_OUT signal 26 relative to REF_CLK signal 22 is dependent at least in part upon CTRL signal 28. Forward delay circuit 12 includes a plurality of delay elements (not shown), such as, for example, buffers or invertors, connected in series. Each of the delay elements has a delay time of one unit delay, or $t_U$. A unit delay can be any period of time appropriate to the application of DLL 10, such as, for example, tens, hundreds or thousands of picoseconds, or longer.

Feedback delay circuit 14 is electrically connected to forward delay circuit 12 and receives therefrom CLK_OUT 26. Feedback delay circuit 14 is further electrically connected to compare circuit COMP 16, and issues thereto FB_CLK signal 24, which is generally a delayed version of CLK_OUT 26. The FB_CLK signal 24 is delayed relative to CLK_OUT 26 by a feedback delay time, $t_{FB}$. The feedback delay time $t_{FB}$ is, for example, substantially equal to the propagation delay $t_P$ of the REF_CLK signal 22 through IC 20. Feedback delay circuit 14 includes one or more delay elements (not shown), such as, for example, buffers or inverters, that delay FB_CLK signal 24 relative to the CLK_OUT signal 26 by feedback time $t_{FB}$. Feedback delay circuit, via feedback delay time $t_{FB}$, models the propagation delay through IC 20 across a predefined range of operating conditions and parameters.

Compare circuit COMP 16 receives REF_CLK signal 22 and FB_CLK signal 24. Compare circuit 16 compares REF_CLK signal 22 to FB_CLK signal 24, and issues COMP signal 30 to control circuit CTRL 18. Compare circuit COMP 16 is conventional in construction and design, such as, for example, a phase detector, and is known to those skilled in the art. COMP signal 30 is indicative of the phase of REF_CLK signal 22 relative to FB_CLK signal 24, and thus indicates whether REF_CLK signal 22 leads or lags FB_CLK signal 24.

Control circuit CTRL 18 is electrically connected to COMP circuit 16 and to forward delay circuit 12. CTRL circuit 18 issues CTRL signal 28 to forward delay circuit 12, and receives COMP signal 30 from COMP circuit 16. Dependent at least in part upon COMP signal 30, CTRL circuit 18 adjusts CTRL signal 28 to thereby increase, decrease or leave unchanged the amount of time by which forward delay circuit 12 delays CLK_OUT signal 26 relative to REF_CLK signal 22, i.e., CTRL signal 28 adjusts the length of the forward delay line of forward delay circuit 12. Control circuit CTRL 18 is configured, for example, as a shift register which causes stored data to move to the right or left one bit position based on the phase difference between REF_CLK signal 22 and FB_CLK signal 24, as will be appreciated by those skilled in the art.

In use, REF_CLK signal 22 is provided to DLL circuit 10 by, for example, an external clock network (not shown). Upon startup, DLL circuit 10 is reset such that forward delay circuit 12 introduces substantially no delay. REF_CLK signal 22 is thus essentially passed undelayed through forward delay circuit 12. CLK_OUT signal 26, i.e., the undelayed version of REF_CLK signal 22 emerging from forward delay circuit 12, is provided to feedback delay circuit 14 which issues FB_CLK signal 24. FB_CLK signal 24 is delayed relative to REF_CLK signal 22 by $t_{FB}$. FB_CLK signal 24 is compared to REF_CLK signal 22 by compare circuit COMP 16. COMP circuit 16 determines the phase relationship of the signals and issues COMP signal 30, which is indicative of that phase relationship, to control circuit CTRL 18.

Control circuit CTRL 18, in turn, issues CTRL signal 28 to adjust, if necessary, the length of the forward delay line of forward delay circuit 12. Assuming the REF_CLK 22 and FB_CLK 24 signals are exactly in phase, CTRL signal 28 sets forward delay circuit 12 to add no additional delay to the CLK_OUT signal 26 relative to REF_CLK signal 22. Thus, CLK_OUT 26 of DLL 10 is initially aligned using the propagation delay of IC 20. As the operating conditions of IC 20 change, and the propagation delay $t_P$ thereof increases or decreases, $t_{FB}$ changes accordingly. The above-described comparison of REF_CLK signal 22 with FB_CLK signal 24 is repeated, with the change in $t_P$ being tracked by a corresponding change in $t_{FB}$. The change in $t_{FB}$ correspondingly alters the delay of FB_CLK signal 24, and thus the length of time by which forward delay circuit 12 delays CLK_OUT 26 relative to REF_CLK signal 22 tracks the change in $t_P$. In order to have the capability to align the clocks in all cases, the delay line of forward delay circuit 12 must be able to increase the delay of CLK_OUT signal 26 up to the length of the cycle time of the lowest operational frequency of REF_CLK signal 22 and/or IC 20.

Referring now to FIG. 2, a block diagram of one embodiment of a DLL of the present invention is shown. DLL 50 includes forward delay circuit 52, feedback delay circuit 54, comparator circuit COMPCKT 56, and control circuit CTRL 58. DLL 50 further includes variable voltage regulator 62. DLL circuit 50 is formed, for example, on a common substrate with or is commonly packaged with and interconnected to, integrated circuit (IC) 70, such as, for example, a dynamic random access memory (DRAM) chip. Generally, and as is described more particularly hereinafter, during design and/or parametric testing of DLL circuit 50, the output voltage of variable voltage regulator 62 is set to thereby adjust and set the duration of the unit delay time $t_U$.

Forward delay circuit 52 receives REF CLK signal 72, and is interconnected with each of control circuit CTRL 58 and variable voltage regulator 62. Forward delay circuit 52 issues clock out signal CLK OUT 76, which is essentially a delayed version of REF CLK signal 72. More particularly, forward delay circuit 52 is electrically connected Lo CTRL circuit 58, and receives therefrom CTRL signal 78. Forward delay circuit 52 issues CLK OUT signal 76 as an output signal. CLK OUT signal 76 is also fed back to feedback delay circuit 52. The amount of time by which forward delay circuit 52 delays CLK OUT signal 76 relative to REF CLK signal 72 is dependent at least in part upon CTRL signal 78. Forward delay circuit 52 includes a plurality of delay elements 5a . . . 52z (only two invertor pairs shown), such as, for example, invertor of buffer pairs. The delay elements 52a . . . 52z are electrically connected in series. Each delay element 52a . . . 52z, i.e., each buffer or inverter pair, has a delay time of one unit delay, or tu. A unit delay can be any period of time appropriate to the application of DLL 50, such as, for example, tens, hundreds or thousands of picoseconds, or longer. Partial block diagram FIG. 2.1 shows pairs of buffer delay elements 52a . . . 52z.

Feedback delay circuit 54 receives CLK_OUT signal 76. Feedback delay circuit 54 is electrically connected to compare circuit COMPCKT 56. Feedback delay circuit 54 issues FB_CLK signal 74 to compare circuit COMPCKT 56. FB_CLK signal 74 is essentially a delayed version of CLK_OUT signal 76. FB_CLK signal 74 is delayed relative to CLK_OUT signal 76 by a feedback delay time, $t_{FB}$. Feedback delay time $t_{FB}$ is substantially equal to the propagation delay $t_P$ of REF_CLK signal 72 through IC 70, and tracks changes in the propagation delay through IC 70 due to the aforementioned external factors. Thus, as the operating conditions and parameters of IC 70 change, feedback delay time $t_{FB}$ tracks any change in $t_P$. Feedback delay circuit 54 includes one or more delay elements (not shown) that delay FB_CLK signal 74 relative to CLK_OUT signal 76 by feedback time $t_{FB}$ and which model and/or track the changes in the propagation delay $t_P$ through IC 70 due to the aforementioned external factors.

Compare circuit COMPCKT 56 receives REF_CLK signal 72 and FB_CLK signal 74. COMPCKT 56 compares REF_CLK signal 72 to FB_CLK signal 74, and issues COMP signal 82 to control circuit CTRL 58. Compare circuit COMPCKT 56 is conventional in construction and design, such as, for example, a phase detector, and is known to those skilled in the art.

Control circuit CTRL 58 is electrically connected to COMPCKT 56 and to forward delay circuit 52. CTRL circuit 58 receives COMP signal 82 from COMPCKT 56, and issues CTRL signal 78 to forward delay circuit 52. Dependent at least in part upon COMP signal 82, CTRL circuit 58 adjusts CTRL signal 78 to thereby increase, decrease or leave unchanged the amount of time by which forward delay circuit 54 delays intermediate CLK_OUT signal 76 relative to REF_CLK signal 72. Control circuit CTRL 58 is configured, for example, as a shift register which causes stored data to move to the right or left one bit position based on the difference between REF_CLK signal 72 and FB_CLK signal 74 as indicated by COMP signal 82, as will be appreciated by those skilled in the art.

Variable voltage regulator (VVR) 62 is electrically connected to a voltage $V_{EXT}$ that is provided by, for example, an external voltage supply or a voltage supply on IC 70 (neither of which are shown). VVR 62 is also electrically connected to forward delay circuit 52. VVR 62 provides to forward delay circuit 52 a voltage $V_{VVR}$. $V_{VVR}$ is electrically connected to supply voltage input 84 of forward delay circuit 52. $V_{VVR}$ is the supply voltage for forward delay circuit 52 and, thus, for each of delay units 52a . . . 52z included therein. As will be explained more particularly hereinafter, $V_{VVR}$ is set during design and/or parametric testing of DLL 50 and/or IC 70 to thereby set the duration of unit delay time $t_U$.

The propagation delay time of a signal through a particular delay unit, i.e., an invertor/buffer pair, varies inversely with the supply voltage provided to that delay unit. Thus, the unit delay time $t_U$ of a delay unit varies inversely with the voltage supplied thereto. For example, as the supply voltage to which a delay unit is connected increases, the unit delay time of that delay unit decreases. Conversely, as the supply voltage to which a delay unit is connected decreases, the unit delay time $t_U$ of that delay unit increases. The inverse relationship between the supply voltage and unit delay time $t_U$ is observed over approximately the recommended operating supply voltage range of a typical delay unit and/or typical invertors/buffers that are interconnected to form a typical delay unit. The actual magnitude of the change in unit delay time $t_U$ relative to a corresponding and inverse change in supply voltage is dependent at least in part upon the technology, such as, for example, complimentary metal oxide (CMOS) or transistor to transistor logic (TTL), of the invertor/buffer pairs.

$V_{VVR}$ is connected to forward delay circuit 52 and, in turn, to each of delay units 52a . . . 52z included therein. A change in $V_{VVR}$ is reflected in a corresponding and inverse change in the unit time delay $t_U$ for each of delay units 52a . . . 52z within forward delay circuit 52. Thus, the unit time delay $t_U$ of delay units 52a . . . 52z is set to a desired value by setting the level of $V_{VVR}$. The process of setting the level of $V_{VVR}$ is more particularly described hereinafter.

The inverse relationship between $V_{VVR}$ and the unit time delay $t_U$ is shown in FIG. 3. REF_CLK signal 72 has a substantially constant frequency under given operating conditions. The CLK_OUT signal 76 that is obtained with $V_{VVR}$ set to a relatively high level, such as, for example, approximately the upper limit of the recommended supply voltage range for IC 70 or DLL 50, is indicated by CLK_OUT signal 76 ($V_{VVRVVR\_HI}$). Conversely, the CLK_OUT signal 76 obtained when $V_{VVR}$ is set to a relatively low level, such as, for example, approximately the lower limit of the recommended supply voltage range for IC 70 or DLL 50, is indicated by CLK_OUT signal 76 ($V_{VVR\_LOW}$). The unit time delay $t_U$ of CLK_OUT signal 76 ($V_{VVR\_HI}$) is indicated by unit time delay $t_{U\_HI}$, whereas the unit time delay $t_U$ of CLK_OUT signal 76 ($V_{VVR\_LOW}$) is indicated by unit time delay $t_{U\_LOW}$. Unit time delay $t_{U\_HI}$ is of a relatively short duration whereas the unit time delay $t_U$ of CLK_OUT signal 76 ($V_{VVR\_LOW}$) is of a relatively long duration. In short, as $V_{VVR}$ increases the unit time delay $t_U$ decreases to $t_{U\_HI}$, and as $V_{VVR}$ decreases the unit time delay $t_U$ increases to $t_{U\_LOW}$. Thus, the unit time delay $t_U$ is set dependent at least in part upon the level of $V_{VVR}$.

The ability to set the unit time delay $t_U$ through the application of a variable $V_{VVR}$ to forward delay circuit 52 and, thus, to delay units 52a . . . 52z, provides distinct advantages. The unit time delay $t_U$ for DLL 50 is adjustably set via the level of $V_{VVR}$ applied to forward delay circuit 52 to thereby adapt DLL 50 to a particular intended application. For example, DLL 50 is adapted for applications wherein a fine lock between the clock signals is desired, and in which the time required to achieve a locked condition is not considered to be critical, through the application of a higher level of $V_{VVR}$ to forward delay circuit 52. The higher level of $V_{VVR}$ reduces the unit delay time $t_U$ and thereby increases the resolution of DLL 50 since the alignment of REF_CLK signal 72 with FB_CLK signal 74 occurs in smaller time increments, i.e., the reduced unit delay time $t_{U\_HI}$. The higher resolution of DLL 50, in turn, provides a finer lock, i.e., a closer alignment, between REF_CLK signal 72 and FB_CLK signal 74. Thus, in such applications, it is desirable to apply a higher level of $V_{VVR}$. Such applications would include, for example, applications in which the reference clock signal is at or near the higher operating frequency range of DLL 50 and/or where a fine lock/alignment is preferred over faster locking times.

Similarly, DLL 50 is adapted for applications that require reduced locking time and only a "coarse" lock between the clock signals through the application of a lower level of $V_{VVR}$ to forward delay circuit 52. The lower level of $V_{VVR}$ increases the unit delay time to $t_{U\_LOW}$. Thus, fewer incremental time delay units $t_{U\_LOW}$ must be introduced to achieve a coarse lock condition between the clock signals. Therefore, the time required to achieve a lock condition is reduced. Such applications would include, for example, applications in which the reference clock signal has a relatively low operating frequency and/or which require only a coarse lock condition.

Figure 4:
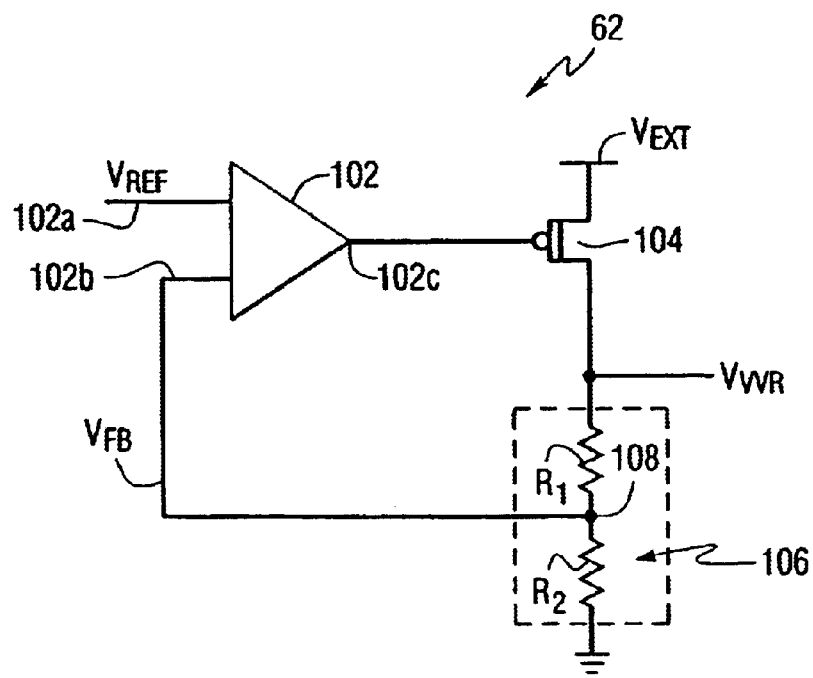
FIG. 4 is a schematic diagram of one embodiment of the variable voltage regulator of FIG. 2.

As stated above, $V_{VVR}$ is set during design and/or parametric testing of DLL 50 and/or IC 70 to thereby set the duration of unit delay time $t_U$. Referring now to FIG. 4, one embodiment of a VVR of the present invention is shown. VVR 62 is formed, for example, on a common substrate with or is commonly packaged with and interconnected to, integrated circuit (IC) 70. VVR 62 includes operational amplifier (op amp) 102, transistor 104, and voltage divider circuit 106.

Op amp 102 includes inputs 102a and 102b, and output 102c. Input 102a is electrically connected to $V_{REF}$, an internally generated reference voltage supply, and input 102b is electrically connected to node 108 and, thus, to voltage $V_{FB}$. Output 102c is connected to transistor 104.

Transistor 104, such as, for example, a p-channel field effect transistor (PFET), is connected between $V_{EXT}$ and voltage divider circuit 106, with output 102c of op amp 102 controlling the gate of transistor 104. Transistor 104 operates in conjunction with op amp 102 to maintain $V_{REF}$ substantially equal to $V_{FB}$. More particularly, op amp 102 senses any decrease in $V_{FB}$ and decreases the voltage at output 102c which, in turn, opens transistor 104 wider, i.e., increases the current flow through transistor 104, thereby increasing the voltage across voltage divider circuit 106 and maintaining $V_{FB}$ approximately equal to $V_{REF}$.

Voltage divider circuit 106 includes node 108 and resistors R1 and R2. Output 102c of op amp 102 is electrically connected to node 108 through resistor R1, and node 108 is connected to ground potential through resistor R2. Node 108 is directly electrically connected to input 102b of op amp 102. $V_{FB}$ is the voltage present at node 108, and thus input 102b is electrically connected to $V_{FB}$. $V_{FB}$ is determined by the ratio of the value of resistor R2 to the sum of the values of resistors R1 and R2. More particularly, $V_{FB}=V_{VVR}$ (R2/(R1+R2)). Accordingly, $V_{VVR}=V_{FB}$ ((R1+R2)/R2). Therefore, $V_{VVR}$ is set by adjusting the ratio of the values of R1 and R2, such as, for example, by laser trimming and/or a mask change to alter the physical dimensions of the resistors. By setting and/or adjusting the ratio of the resistance values of resistors R1 and R2, a desired value of $V_{VVR}$ is obtained. Forward delay circuit 14 is supplied with $V_{VVR}$. As described above, unit time delay $t_U$ varies inversely with the voltage supplied to delay units 52a . . . 52z. Therefore, $t_U$ is set to a desired value by setting $V_{VVR}$ through the adjustment of the ratio of the resistance values of R1 and R2, and DLL 50 is quickly and easily adapted during fabrication and/or processing to different application requirements without the need for redesign or separate manufacturing runs.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A delay lock loop circuit receiving a reference clock signal, said delay lock loop (DLL) circuit aligning in time an output clock signal thereof with an internal feedback clock signal, said DLL circuit comprising:

a settable voltage regulator configured for receiving an external supply voltage, a settable supply voltage issued by said settable voltage regulator; and a forward delay circuit powered at least in part by said settable supply voltage, said forward delay circuit receiving said reference clock signal, said forward delay circuit issuing said output clock signal, said forward delay circuit adjustable shifting in time said output clock signal relative to said reference clock signal;

a feedback delay circuit receiving said output clock signal and issuing a feedback clock signal;

a comparator circuit receiving said feedback clock signal and said reference clock signal, said comparator circuit issuing a compare signal indicative of the phase of said reference clock signal relative to said feedback clock signal; and a control circuit receiving said compare signal and issuing a control signal, said control signal being received by said forward delay circuit.

2. The delay lock loop circuit of claim 1, wherein said forward delay circuit includes a plurality of delay units electrically interconnected in series, each of said delay units being electrically connected to and powered by said settable supply voltage.

3. The delay lock loop circuit of claim 2, wherein each of said plurality of delay units comprises one of an inverter pair and a buffer pair.

4. The delay lock loop circuit of claim 1, wherein said settable voltage regulator comprises:

an op amp having first and second inputs and an output, said first input electrically connected to a reference voltage supply, said second input electrically connected to a feedback voltage:
a voltage divider circuit;
a transistor electrically interconnected between an external supply voltage, said output of said op amp, and said voltage divider circuit, said transistor controlling the flow of current from the external supply voltage through said voltage divider circuit dependent at least in part upon a voltage level of said output of said op amp.

5. The delay lock loop circuit of claim 4, wherein said voltage divider circuit includes at least two resistors interconnected at a common node, said second input of said voltage divider circuit electrically connected to said common node to thereby connect said feedback voltage to said second input.

6. The delay lock loop circuit of claim 5, wherein said settable supply voltage is determined by a ratio of resistance values of said at least two resistors of said voltage divider circuit.

* * * * *